US005478221A

United States Patent [19]

Loya

[11] Patent Number: 5,478,221
[45] Date of Patent: Dec. 26, 1995

[54] MINIATURE FAN FOR PRINTED CIRCUIT BOARD

[75] Inventor: Rami Loya, Rockville, Md.

[73] Assignee: LZR Electronics, Inc., Gaithersburg, Md.

[21] Appl. No.: 188,714

[22] Filed: Jan. 31, 1994

[51] Int. Cl.[6] .................................................. F04B 53/22
[52] U.S. Cl. ......................... 417/313; 417/360; 439/572
[58] Field of Search ........................... 417/313, 53, 360; 439/78, 83, 572

[56] References Cited

U.S. PATENT DOCUMENTS

| | | | |
|---|---|---|---|
| 2,922,054 | 1/1960 | Miller | 310/71 |
| 2,924,809 | 2/1960 | Wilson | 439/573 |
| 4,296,455 | 10/1981 | Leaycraft et al. | 361/383 |
| 4,513,812 | 4/1985 | Papst et al. | 165/80 B |
| 4,663,695 | 5/1987 | Ohkawara et al. | 361/405 |
| 4,826,442 | 5/1989 | Douty et al. | 439/92 |
| 4,885,488 | 12/1989 | Cox | 310/68 R |
| 4,926,291 | 5/1990 | Sarraf | 361/384 |
| 5,020,138 | 5/1991 | Yasuda et al. | 455/115 |
| 5,191,230 | 3/1993 | Heung | 307/141 |
| 5,240,422 | 8/1993 | Kobayashi et al. | 439/78 |
| 5,381,050 | 1/1995 | Siclari | 307/112 |
| 5,406,038 | 4/1995 | Reiff et al. | 181/167 |

OTHER PUBLICATIONS

IBM Technical Disclosure Bulletin, Apr. 1985, vol. 27 No. 11 pp. 6568–6569.

Primary Examiner—Richard A. Bertsch
Assistant Examiner—Peter G. Korytnyk
Attorney, Agent, or Firm—Longacre & White

[57] ABSTRACT

A miniature fan is mounted on a printed circuit board (PC board) and circulates air to help dissipate heat in enclosed electronic packages. The fan blades may rotate in a direction parallel or perpendicular to the plane of the PC board depending on available space. The method of mounting the miniature fan may be incorporated directly into the presently existing methods by which electrical components are mounted on a PC board, and which simplifies the mounting and manufacturing process such that mounting screws, lead wires, connectors, etc are eliminated, thus increasing efficiency and reducing cost.

23 Claims, 5 Drawing Sheets

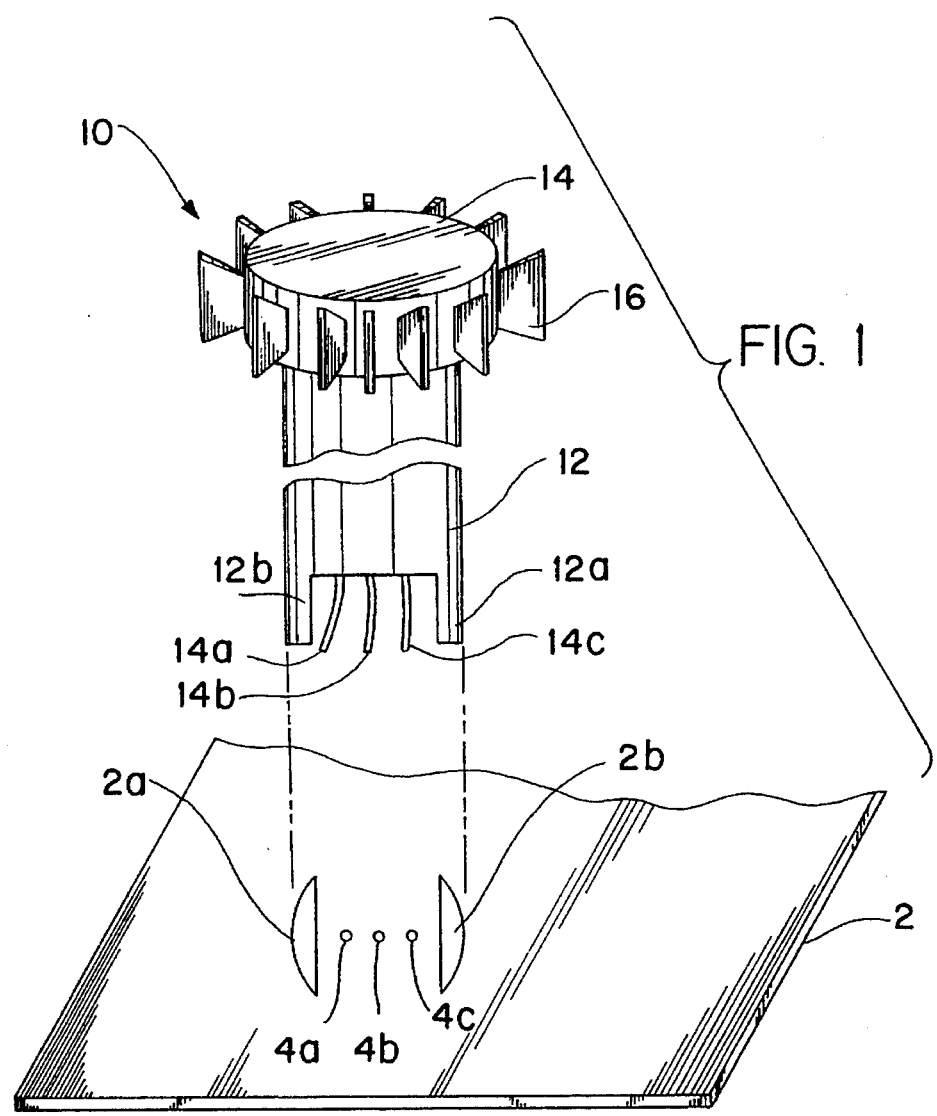
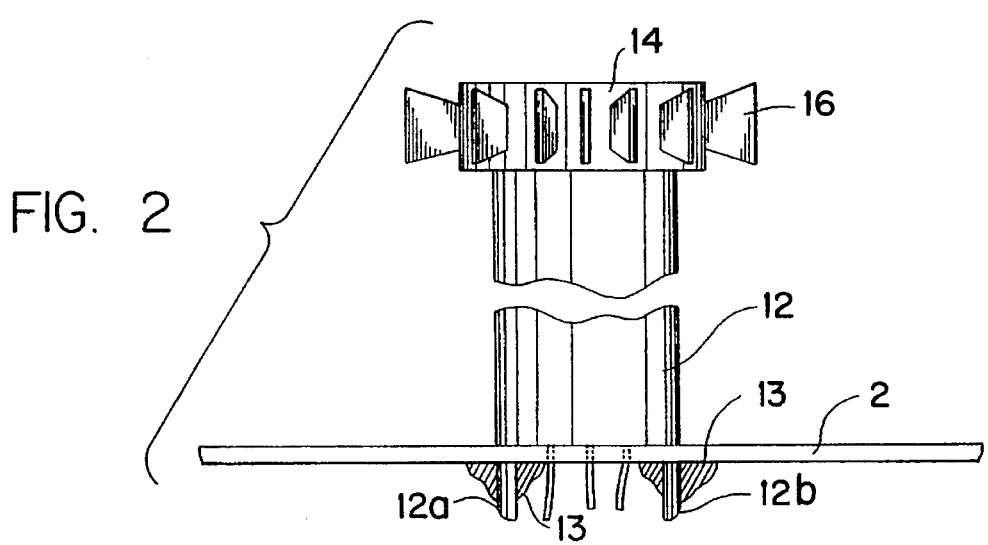

MINIATURE FAN FOR PRINTED CIRCUIT BOARD

BACKGROUND OF THE INVENTION a) Field of the Invention

The invention relates to a miniature fan which is mounted on a printed circuit board and circulates air to help dissipate heat in enclosed electronic packages. The structure of the invention allows the miniature fan to be mounted in a method which simplifies the mounting process of the fan onto the circuit board such that mounting screws or hand soldering of lead wires are eliminated, thus increasing efficiency and reducing cost.

b) Description of Related Art

Most electronic devices, such as used in electronic circuits, have high performance characteristics, and are low in mass and volume which results in high circuit density. During operation great amounts of heat are developed inside the enclosed device which must be dissipated and removed from the enclosed device to avoid failure due to heat build-up. The device cannot store this heat, and so the heat must be dissipated. One method is the use of heat sinks which are mounted in contact with heat generating electronic parts. The heat sinks transfer the developed heat to a greater area. But this is not sufficient in most instances, and so the further removal of heat is brought about by forced cooling air. Generally, such forced air is accomplished by fans mounted within the electronic device. These fans are typically mounted on the circuit enclosures device housing by means of screws or bolts which require a separate circuit assembly step.

For instance, U.S. Pat. No. 5,191,230 to Heung discloses a circuit module fan assembly wherein multiple modular circuit boards are mounted in parallel within a circuit housing. A modular fan assembly board is mounted in parallel with these modular circuit boards in order to dissipate heat therefrom. The assembly of Heung requires a separate circuit board for the modular fan assembly which is bolted thereto.

U.S. Pat. No. 4,885,488 to Cox discloses a miniature fan mounted on a printed circuit board. However, the assembly of Cox comprises a permanent magnet disposed on a first side of the circuit board and electromagnets on the opposite side about a bearing member; threaded members rotatably secure the fan blade to the bearing member. The assembly of Cox requires a plurality of screws or bolts to mount the assembly to the circuit board, and is disposed on both side of the circuit board.

U.S. Pat. No. 4,513,812 to Papst et al. discloses a heat sink fan mounted directly on a heat sink plate with cooling ribs. The fan is disposed in a manner to provide efficient forced air cooling between the heat sink cooling ribs, however, is not suitable for assembly directly on a printed circuit board and requires mounting cooling ribs or vanes.

Electric devices i.e. transistors, capacitors, resistors, mounted on the PC boards are typically provided with mounting pins which pass through the PC board and are subjected to a wave soldering process whereby these components are soldered in place in an assembly-line fashion. The prior art cooling fans are mounted on the housing or PC board by screws and bolts, thus cannot be incorporated into the electric device assembly process, and require an additional assembly step.

SUMMARY OF THE INVENTION

The object of the invention is to provide a printed circuit (PC) board mounted miniature fan which is mounted to a circuit board in a simplified and efficient manner in order to dissipate heat in enclosed electronic packages.

The miniature fan of the invention is mounted directly on the PC board and then either soldered to the PC board to provide the mechanical support to hold the fan/motor assembly in place while in operation, or formed with means which clip in place on the PC board in a secure manner. Pins, terminals or leads project from the motor's mounting structure and pass through the PC board. These lead wires function to supply power to the fan assembly, and to control other motor control functions.

Additionally, the fan may be secured to the PC board by surface mount technology wherein the support structure of the fan does not project through the PC board, but instead is soldered in place on one side of the board.

The fan assembly of the invention may be mounted in several orientations with respect to the plane of the PC board: vertical PC board mounted; right-angle PC board mounted; fan mounted in a frame which then either vertically or horizontally mounted. For each of these arrangements, the mounting is accomplished in a simplified manner depending on the circuit environment in which it is incorporated.

The fan may also be integrated with the PC board such that the PC board is part of the fan's construction. This integrated fan/PC board assembly is then mounted either on a separate PC board or other mounting member within the enclosed electronic package.

The fan's blade diameter, height and motor size can vary according to the air cooling requirements of the circuit. Moreover, the fan may be equipped with a safety switch which disables the fan when the enclosure is opened.

BRIEF DESCRIPTION OF THE DRAWINGS

FIG. 1 is an exploded perspective view of the first embodiment of the invention and associated printed circuit board.

FIG. 2 is an elevation view of the embodiment of FIG. 1.

FIG. 4b is a side view of the framed motor assembly of FIG. 4a.

DESCRIPTION OF THE PREFERRED EMBODIMENTS

Figure 2A:
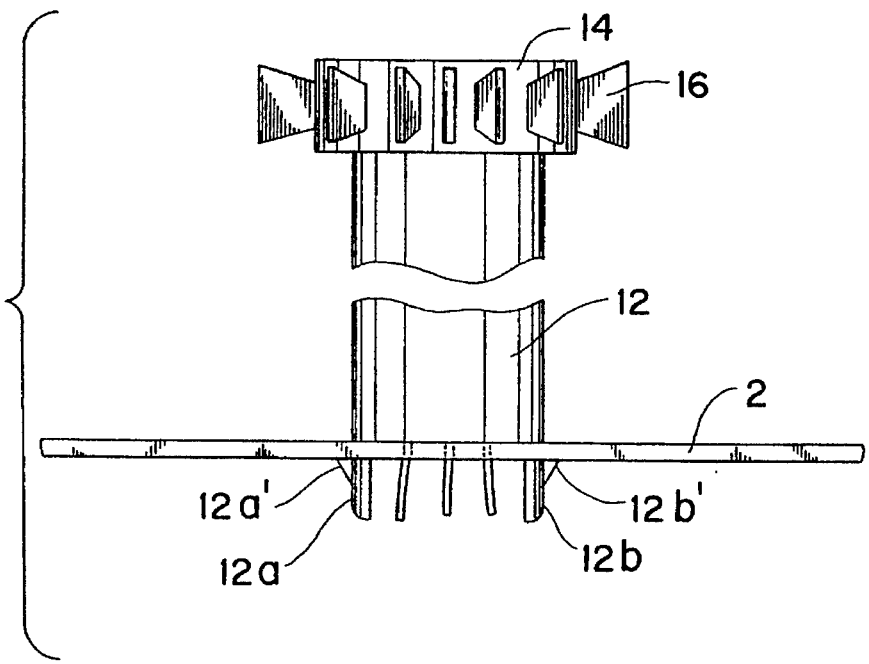
FIG. 2a is an elevation view of an alternate embodiment whereby the mounting legs are formed with clips which secure the fan assembly to the printed circuit board.

The method and apparatus of the following invention may be incorporated directly into the currently existing methods by which electrical components are mounted on a printed circuit board (PC board). Electrical components, i.e. resistors, transistors, and capacitors, are typically positioned and electrically connected on the PC board in an assembly-line manner. More specifically, electrical components are typically provided ,with mounting pins which correspond to mounting holes provided in the PC board. During assembly, a plurality of electrical components are positioned on one side of a PC board whereby the mounting pins are received through the mounting holes in the PC board, and then soldered from the underneath by various soldering processes to both secure the components to the board and provide the necessary electrical connections. The following invention is intended to be incorporated in an efficient manner into the known PC board and electrical component manufacturing processes.

FIGS. 1 and 2 illustrate a first embodiment of the invention wherein a fan assembly 10 is mounted onto a PC board 2 such that a fan pole 12 extends vertically from the PC board 2, and supports a dc motor 14 via mounting legs 12a, 12b. Fan blades 16 are driven by the dc motor 14 to rotate in a plane parallel to the plane of the PC board 2. An electrical connection is provided by motor lead wires 14a, 14b, 14c which pass through the PC board in a manner similar to the mounting legs 12a, 12b (FIG. 2) and which provide control signals to the fan motor. A forced-air flow is thereby generated in a direction along the plane of the PC board.

As shown in FIG. 1, the PC board 2 comprises a PC board hole layout corresponding to the fan assembly wherein the mounting legs 12a, 12b are received in the holes 2a, 2b to support the fan assembly described above. Similarly, the motor lead wires 14a, 14b, 14c representing the control function wires respectively for the motor 14 pass through the PC board lead wire holes 4a, 4b, 4c.

After being received in the PC board hole layout, a soldering process may be used to secure the mounting legs 12a, 12b and motor lead wires 14a, 14b, 14c to the PC board. FIG. 2 illustrates a solder bead 13 affixing the mounting legs 12a, 12b to the underside of the PC board 2. The mounting legs 12a, 12b may also be formed as snap clips which are securely received in the holes 2a, 2b. FIG. 2a illustrates an arrangement whereby the mounting legs 12a, 12b are secured to the circuit board by means of snap clips 12a', 12b' formed as part of the mounting legs 12a, 12b. For each of these embodiments, the miniature fan provides a mounting arrangement which may quickly and surely be secured to the PC board without the use of screws or bolts.

The particular PC board hole layout may vary depending on the fan assembly employed and the circuit design which is being serviced or cooled by the fan assembly. For instance, the two support hole arrangement of FIG. 1 may be designed with three or more holes for better fan stability. Moreover, the mounting legs 12a, 12b are not limited to the arrangement illustrated in the accompanying drawings, but are intended to represent a variety of arrangements whereby the fan assembly may be quickly and surely mounted on a circuit board without additional fasteners, i.e. screws, bolts, etc.

Figure 2B:
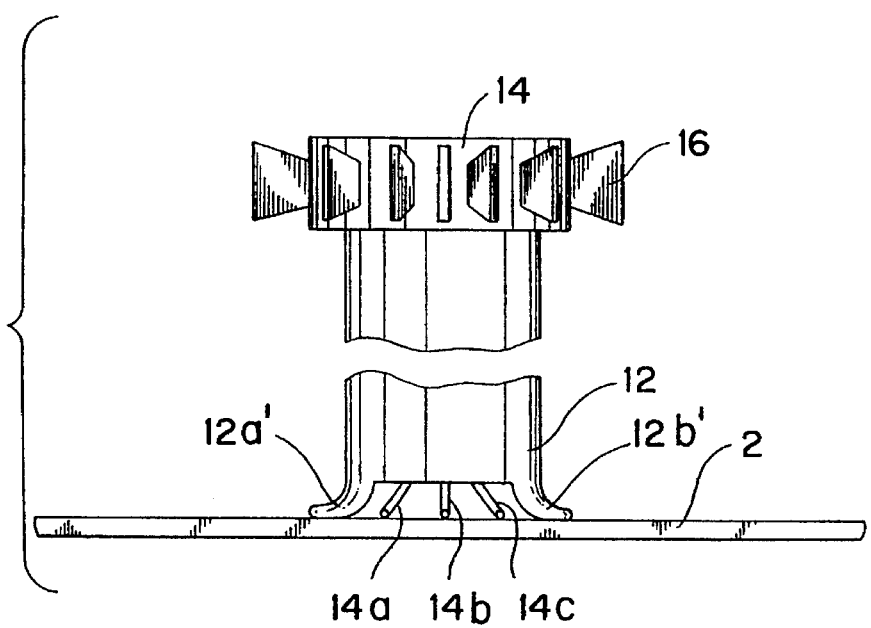
FIG. 2b is an elevation view of another alternate embodiment whereby the mounting legs are formed with supporting portions particularly formed for Surface mounting to one side of the printed circuit board.

FIG. 2b is an elevation view of another embodiment whereby the mounting legs 12a and 12b of FIGS. 2 and 2a are alternately formed as supporting or wing portions 12a' and 12b' which are surface mounted to one side of the printed circuit board. For this arrangement, the supporting portions 12a', 12b' are soldered to the side of the PC board, to which the other electrical components are supported without, passing through the PC board. The particular design of the supporting portions 12a', 12b' is dependent upon the fan size and board circuitry arrangement. As with the foregoing embodiments, fan mounting is accomplished without additional fasteners or fastening steps beyond soldering. Control wires are also provided which may or may not pass through the PC board. For the embodiment of FIG. 2b, the lead wires 14a–14c do not pass through the board as shown.

Figure 3:
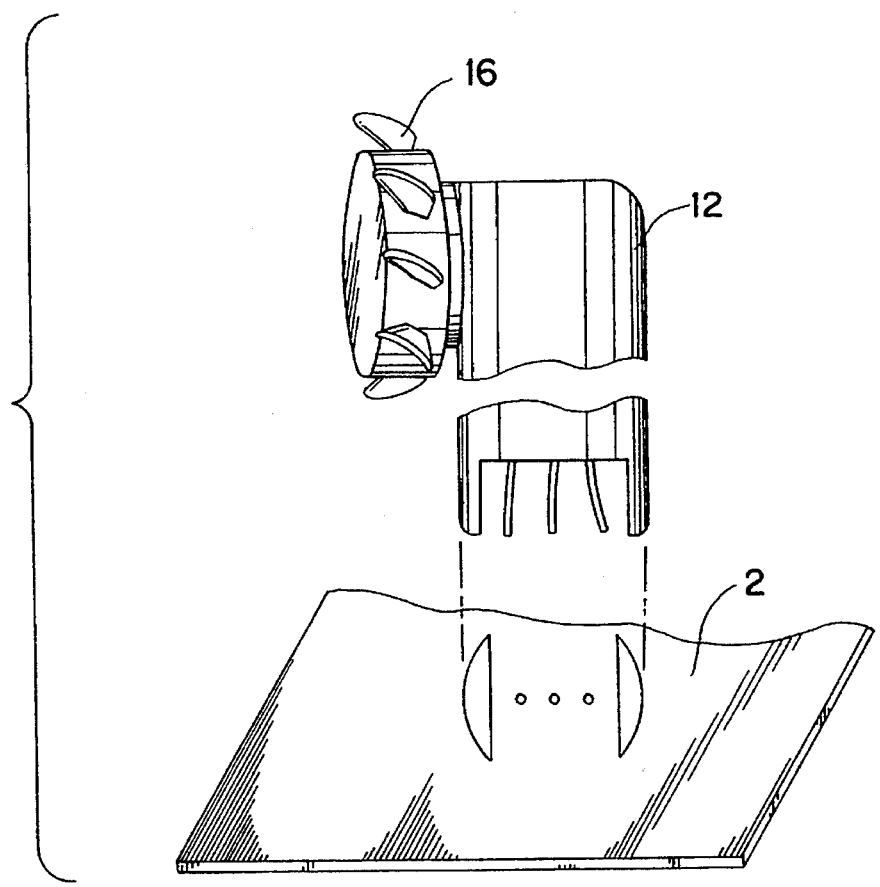
FIG. 3 is an exploded perspective view of the second embodiment of the invention and associated printed circuit board.

FIG. 3 is an alternate embodiment wherein the fan pole 12 is provided at a right angle to support the blades 16 for rotation in a plane perpendicular to the plane of the PC board 2. The remaining structure of the embodiment of FIG. 3 is the same as the first embodiment of FIG. 1. The arrangement of FIG. 3 is particularly suitable when the circuit board space is limited with respect to the available height. On the other hand, when circuit board space exceeds the height limitations created by the housing assembly or other constraints, the embodiments of FIG. 1, or FIG. 5 to follow are desirable.

Figure 4A:
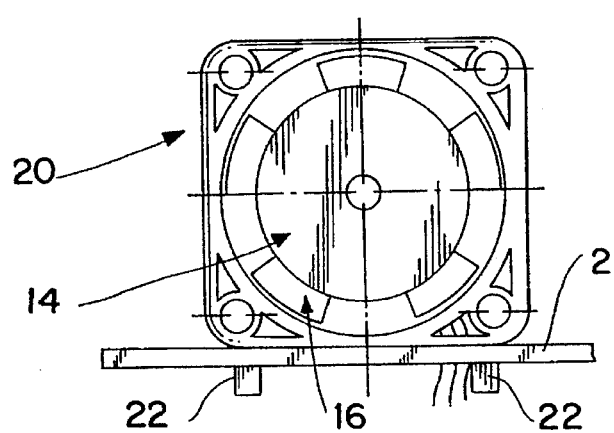
FIG. 4a is an elevation view of the framed motor assembly of the third embodiment of the invention.
Figure 4B:
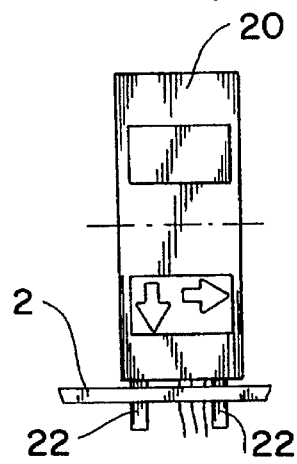

In an alternate embodiment of the invention, the fan motor and blades may be contained within a frame member in order to provide additional stability and safety. As shown in FIGS. 4a & 4b, the motor 14 and blades 16 are contained within a frame or fan housing 20. For the embodiment of FIGS. 4a & 4b, the mounting legs 22 may be provided directly on the frame member 20, or may be provided on the motor mounting to project from the frame member 20. In the side view of FIG. 4b, it is shown that more than two mounting legs 22 may be provided to further support and stabilize the frame and fan assembly. The framed fan assembly of FIGS. 4a & 4b is mounted on the PC board in the same manner as the embodiments of FIGS. 1–3 described above.

Figure 5:
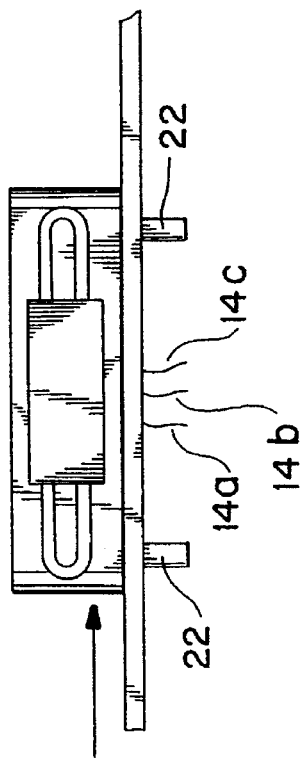
FIG. 5 is an elevation view of the framed motor assembly according to the fourth embodiment of the invention.

FIG. 5 illustrates another embodiment comprising a framed fan assembly wherein the frame is mounted horizontally on the PC board. As with the previous embodiments, the mounting legs 22 are received through the PC board along with the motor lead wires 14a, 14b, 14c, and may either be soldered in place or may comprise snap clips formed thereon which fastening to the PC board.

It should be noted that for the foregoing embodiments, each fan's blade diameter, motor size and height from the PC board can vary according to each model's requirements, PC board space limitations, and other specifications as needed.

Figure 6:
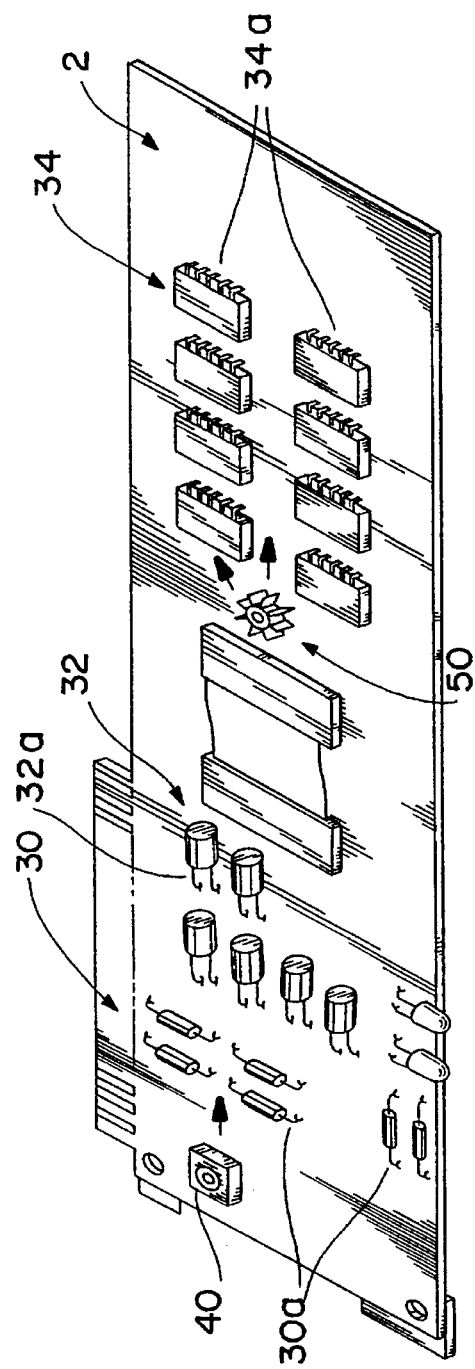
FIG. 6 is a perspective view of a printed circuit board with electrical components and miniature fans.

The mounting assembly method of the invention will now be described with reference to FIG. 6 wherein the fan assemblies are positioned directly on a circuit board 2. For the circuit board arrangement, numerous electrical components 30, 32 and 34 are mounted on the PC board 2 via pins 30a, 32a, 34a which pass through the board and for soldering at the other side. Similarly, the fans 40 and 50 are mounted on the PC board via mounting legs (see FIGS. 1–5) which pass through the PC board. Motor lead wires also pass through the board 2. The mounting legs and lead wires may be soldered at the other side of the PC board in a known manner in order the stabilize the miniature fans to the board and to provide the necessary electrical connections. In an alternate embodiment, the mounting legs are formed as clip members which fasten the fan assembly to the circuit board without the use of solder, while the lead wires are soldered to form an electric circuit supplying power to the fan motor. These fans 40, 50 provide a forced-air circulation in the direction of the arrows to dissipate heat from these electrical components.

Figure 7:
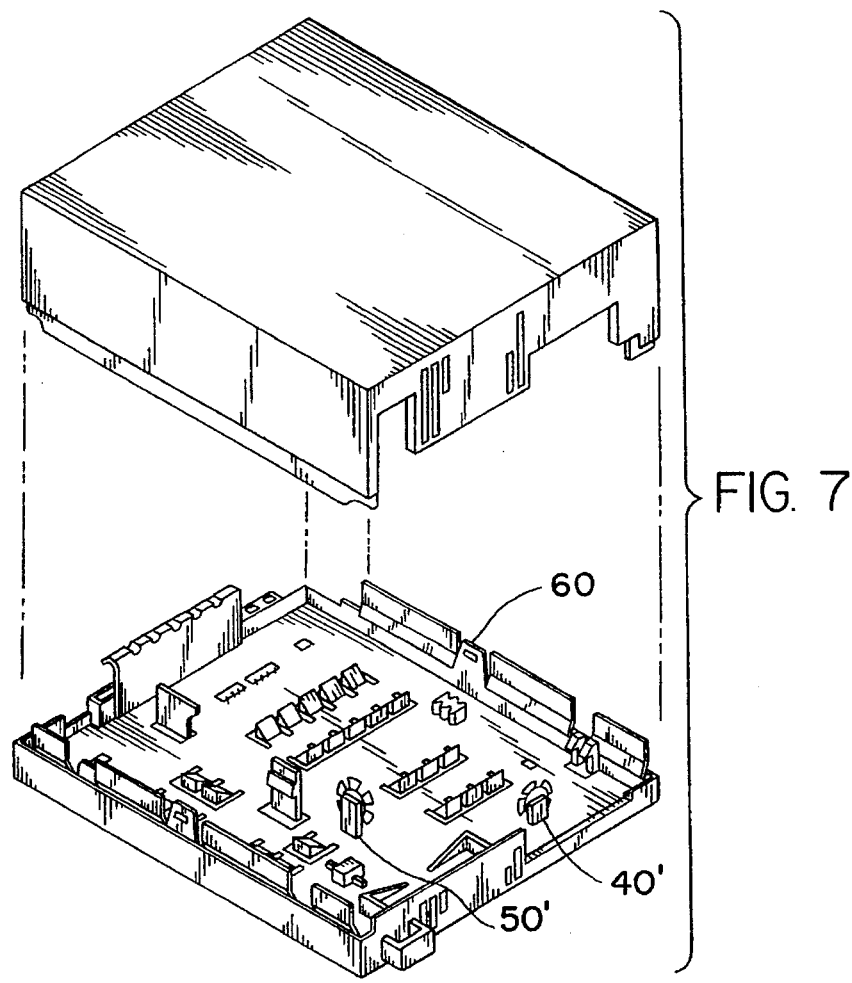
FIG. 7 is an exploded perspective view of the miniature fan and circuit board assembly with housing.

The present invention is also provided with an optional safety switch illustrated at FIG. 7 whereby during assembly or repair, the miniature fan(s) are disabled to prevent injury or damage to the electrical device. Specifically, the PC board 2 of the type illustrated at FIG. 6 is typically positioned within a housing assembly in a known manner. However, the PC board 2 of FIG. 7 is also provided with miniature fans 40' and 50' which provide forced-air cooling of the electrical components contained therein. A cut-off switch 60 therefore provided in the assembly in order to disable the fans 40' and 50' when the housing is dismantled during assembly or repair.

Figure 8:
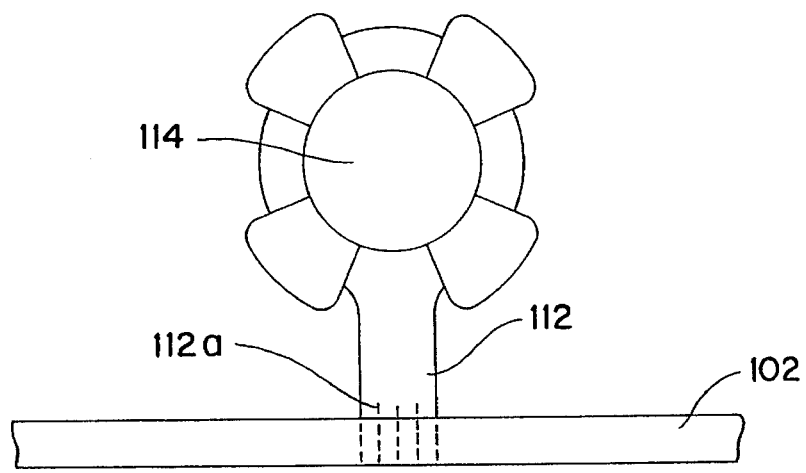
FIG. 8 is a front view of an alternate ,embodiment of the invention wherein a first PC board is part of the fan's construction and this fan/PC board construction is mounted to a separate PC board.

FIG. 8 illustrates an alternate embodiment wherein the fan assembly comprises an integrated PC board, and the entire fan/PC board assembly is mounted to a separate or primary PC board in a manner similar to the embodiments described above. As illustrated in FIG. 8, the fan 114 is formed with the integrated PC board 112. This arrangement is then mounted to the primary PC board 102. The integrated PC board 112 is formed with mounting tracks or fingers 112a for mounting on the primary PC board 102. For the arrangement of FIG. 8, several advantages are gained. First, the fan assembly may be mounted in a simple two step method without numerous fasteners whereby the fan is first mounted to the integrated PC board, then to the primary board once the cooling requirements are established. Second, the integrated PC board may be provided with additional fan control circuitry suited for particular electrical component environments.

While the foregoing invention has been particularly shown and described with reference to accompanying drawings, it should be understood by those of skill in the art that various modifications in form and detail may be made therein without departing from the spirit and scope of the invention.

I claim:

1. A fan assembly for dissipating heat from heat generating electrical components, said fan assembly being adapted for mounting on a printed circuit board as a unitary body comprising:

fan blade means for circulating air upon rotation thereof;

a motor means for rotating said fan blade means;

supply means for supplying a control signal to said motor means;

mounting means for securing said motor and fan blade means to said circuit board, wherein said mounting means comprises at least one mounting leg formed integrally with said motor means and adapted to pass through said printed circuit board from a first side to a second side of said circuit board, said mounting leg being securely fastened to said circuit board.

2. The fan assembly according to claim 1, wherein said at least one mounting leg is soldered at said second side of said circuit board.

3. The fan assembly according to claim 1, wherein said at least one mounting leg is formed as a clip member which secures said motor and fan blade means to said circuit board upon passing through said circuit board.

4. The fan assembly according to claim 1, wherein said fan blade means is adapted to rotate in a rotation plane parallel to a plane defined by said circuit board.

5. The fan assembly according to claim 1, wherein said fan blade means is adapted to rotate in a rotation plane perpendicular to a plane defined by said circuit board.

6. The fan assembly according to claim 1, wherein said supply means comprise a plurality of lead wires, said lead wires being adapted to paps through at least one hole provided in said circuit board.

7. The fan assembly according to claim 1, wherein said mounting means comprises a pole member securing said motor to said mounting legs.

8. The fan assembly according to claim 7, wherein said pole member is formed as an angled member to alter the rotation of said blade means with respect to said circuit board.

9. The fan assembly according to claim 1, further comprising a frame assembly means for supporting and partially encasing said fan blade means, wherein said mounting legs secure said frame assembly means to said circuit board.

10. The fan assembly according to claim 9, wherein said frame assembly means supports said fan blade means to rotate in a rotation plane parallel to a plane defined by said circuit board.

11. The fan assembly according to claim 9, wherein said frame assembly means supports said fan blade means to rotate in a rotation plane perpendicular to a plane defined by said circuit board.

12. The fan assembly according to claim 1, further comprising a switch means for disabling said motor means during servicing thereof.

13. The fan assembly according to claim 1, wherein said mounting means comprises an additional PC board to which the motor means is mounted.

14. The fan assembly according to claim 1, wherein said at least one mounting member is soldered at said side of said circuit board.

15. A method of assembling a circuit board and miniature fan assembly to facilitate the dissipation of heat therefrom, comprising the steps of:

positioning a fan means for circulating air on a first side of said circuit board, said fan means being a unitary body comprising a support means;

passing a support means through a receiving hole formed in said circuit board;

securely fastening said support means to said circuit board.

16. The method according to claim 15, wherein said step of securely fastening comprises soldering said portion of said support means to said circuit board.

17. The method according to claim 15, wherein said step of securely fastening comprises clipping said support means to said circuit board.

18. The method according to claim 15, further comprising the step of passing lead wires through said circuit board, said lead wire supplying a control signal to said fan means.

19. The method according to claim 15, further comprising enclosing said circuit board with a housing means for enclosing said circuit board.

20. The method according to claim 19, further comprising providing a switch means for disabling said miniature fans means when said housing means is disassembled.

21. The method according to claim 15, wherein said miniature fan means comprises a blades means for circulating air and a motor means for rotating said blade means.

22. The method according to claim 21, further comprising the step of enclosing said blade means in a frame assembly.

23. A fan assembly for dissipating heat from heat generating electrical components, said fan assembly being adapted for mounting on a printed circuit board as a unitary body comprising:

fan blade means for circulating air upon rotation thereof;

a motor means for rotating said fan blade means;

supply means for supplying a control signal to said motor means;

mounting means for securing said motor and fan blade means to said circuit board, wherein said mounting means comprises at least one mounting member formed integrally with said fan blade means and adapted to contact a side of said printed circuit board, said at least one mounting member being securely fastened to said side of said circuit board.

* * * * *